United States Patent [19]

Cederberg et al.

[11] 4,023,998

[45] May 17, 1977

[54] METHOD FOR THE PRODUCTION OF THROUGH HOLES IN A LAMINATE

[75] Inventors: Kjell A. Cederberg; Jiri K. Konicek; Hans R. Malm, all of Perstorp, Sweden

[73] Assignee: Perstorp AB, Perstorp, Sweden

[22] Filed: Aug. 26, 1975

[21] Appl. No.: 607,939

[30] Foreign Application Priority Data

Sept. 27, 1974 Sweden .......................... 74.121690

[52] U.S. Cl. .............................. 156/630; 156/247; 156/253; 156/645; 156/644; 156/659; 156/665; 204/24; 204/32 R; 204/38 B; 204/129.65; 252/79.2

[51] Int. Cl.$^2$ ......................................... C23F 1/02

[58] Field of Search .................. 156/3, 6, 7, 13, 16, 156/18, 22, 247, 249, 253; 204/24, 32 R, 129.1, 11-15, 38 B, 129.55, 129.65; 174/68.5; 252/79.2; 29/580, 625; 96/36.2

[56] References Cited

UNITED STATES PATENTS

| 3,653,997 | 4/1972 | Rothschild et al. .................... 156/3 |
| 3,719,536 | 3/1973 | Rheingold et al. .................... 156/6 |
| 3,936,548 | 2/1976 | Konicek ............................ 156/3 X |

*Primary Examiner*—William A. Powell
*Attorney, Agent, or Firm*—Stevens, Davis, Miller & Mosher

[57] ABSTRACT

A method for the production of through holes in a laminate comprising an insulating base provided with a thin metal layer on at least one side, said laminate being intended for printed wiring. The method is characterized in that the thin metal layer is provided with a firmly adhering and protective foil or layer of a material being chemically different from the thin metal layer and that so-called burrs in the thin metal layer obtained during a mechanical machining of the holes are removed by dissolution whereupon the protective foil or layer can be removed.

9 Claims, No Drawings

METHOD FOR THE PRODUCTION OF THROUGH HOLES IN A LAMINATE

The present invention relates to a method at the production of through holes in a laminate comprising an insulating base clad with a thin metal layer on at least one side.

Printed wiring is used to a large extent in the electronics industry. At said technique a printed wiring board is used. Said board is at present usually produced with a copperclad insulating sheet or laminate as starting material.

Comparatively simple kinds of printed wiring boards are manufactured by etching a laminate clad with copper on only one side. Then a copy of the desired wiring pattern is transferred to the copper layer before the etching for example by printing or by a photochemical process. The applied copy, the so called etch resist, constitutes a protection at the etching of superfluous copper. After the etching the etch resist is removed.

More technically advanced printed wiring boards are equipped with wiring patterns on both sides of the laminate and so called plated through holes for electrical connection between the two sides. These printed wiring boards are usually produced from laminates clad with copper on both sides. The process for the production of these boards includes machining of holes, plating with copper, and etching.

Printed wiring boards having wiring patterns in many planes, so called multilayer printed wiring boards are also produced to a large extent. Plated through holes are also used in this process.

Plated through holes can be used even if the insulating base has a wiring pattern on only one side.

Then the electronic components are mounted to the completed printed wiring board. The copper conductors give necessary electrical connections and the laminate gives mechanical support.

The most common insulating bases are paper-reinforced phenolic resin laminates which are used for comparatively simple circuits and glass fibre reinforced epoxy resin laminates which are used where the technical requirements are higher. Use is also made of fibre reinforced plastic laminates of other types, for example, glass fibre reinforced polyester resin, and glass fibre reinforced polyimid resin. Base materials of the type plastic films, non-fibre reinforced plastic sheets and plastic coated metal plate are also used.

For producing the copper coating or layer it is common to use copper foils or sheets which are placed on a base-forming fibre material impregnated with partially cured or hardened plastic (so called prepreg). Then the composite material is moulded at high pressure and increased temperature, whereby a final curing of the plastic is obtained which results in a conversion of the material into a fibre reinforced plastic sheet to which the copper foil is firmly joined. According to another usual method the copper foil is glued to a plastic film by means of heat and pressure. The copper foil has usually a thickness of 35 $\mu$m, but also thicker and thinner foils are used. Lately another process has come into use. According to said process a temporary base foil plated with a layer of copper or a copper alloy is joined to the insulating final base in a way similar to the one described above in connection with the copper foil. For example the temporary base can consist of aluminium. The plated metal layer on the temporary base is very thin, for example 5 $\mu$m. When the temporary base has been removed from the composite material, an insulating base clad with a very thin layer of copper or copper alloy is obtained, which thin layer constitutes a base for the conductors of the printed wiring board. Said conductors are intended to receive an increased thickness by plating. Such a process is described in the Belgian Pat. No. 788,117.

At the production of printed wiring boards of the type mentioned above, which have a wiring pattern comprising plated through holes, the machining of holes is brought about by drilling or punching. Machining of holes is an early working step driving the production of the printed wiring board.

Consequently, independant of which one of the processes mentioned above that is used for applying a copper foil or a thin metal layer to the insulating base, the machining of holes in the laminate obtained is usually brought about before the wiring pattern has been etched out in the copper foil or the thin metal layer. Drilling is usually carried out at a high drilling velocity and by the help of computor-controlled drilling machines. Thousands of holes are drilled with each drill. During the drilling the drill is gradually worn out and as a rule this results in certain deteriorations in the quality of the holes.

At the drilling of the kind of laminates described above so-called burrs are formed in the thin metal layer at the edges of the holes in connection with the penetration of the drill into the metal layer or when the drill forces its way out of the laminate. Among other things these burrs depend on the mentioned wear of the drill and they can be as high as 25 $\mu$m. Also at punching a troublesome formation of burrs is obtained. Burrs are not desirable at the further machining of the laminate to a printed wiring board. Therefore, they must be removed. This is usually carried out by mechanical methods such as blasting or grinding. However, these methods suffer from the drawbacks that the burrs are difficult to remove or that parts of the grinding material can contaminate the metal surface and cause disturbances at the further processing of the laminate. Thus, at grinding the burrs are often pushed into the holes. These negative influences of the grinding arise independent of the thickness of the thin metal layer.

Therefore, for a long time there has been a strong desire to be able to decrease the size of the burrs and to remove them by another method than grinding or blasting.

According to the present invention one has been able to satisfy the mentioned desire and bring about a method for the production of through holes in a laminate comprising an insulating base provided with a thin metal layer on at least one side, said laminate being intended for the production of printed wiring. The method according to the invention is characterized in that the thin metal layer is provided with a firmly adhering and protective foil or layer of a material being chemically different from the metal layer and that so-called burrs obtained in the thin metal layer at a mechanical machining of holes are removed by dissolution whereupon the protective foil or layer can be removed.

The protective foil or layer can consist of metal or plastic. Suitable metals are for example aluminium, nickel, chromium, tin, lead, or any one of their alloys.

If, for example the thin metal layer is clad with an exterior protective foil of aluminium or aluminium alloy according to the invention the main part of the burr will occur in the aluminium foil and not in the thin metal layer. In spite of that, burrs can occur in the thin metal layer. However, the height of the burrs usually are less than that which is obtained by drilling without a protective foil. Thus, even if protective foil has a most considerable effect on the decrease of the size of the burrs, a subsequent treatment is necessary to remove the arisen burrs. According to the invention this treatment consists of a dissolution of the burrs by the help of an agent which can dissolve the constituents of the thin metal layer but does not attack the protective foil or layer. Alternatively an agent is used which can dissolve the constituents of the thin metal layer faster than the material of the protective foil or layer. In both cases the agent will rapidly dissolve the burrs in the thin metal layer. The remaining surface of the thin metal layer is effectively protected by the aluminium foil against undesirable dissolution. The dissolution can for example be carried out by etching or by anodical dissolution.

There are many suitable etching agents which can be used. Among these ammonium persulfate, 10 percent nitric acid, or 2 percent hydrogen peroxide together with sulphuric acid can be mentioned. The choice of etching agent is not critical on condition that the agent satisfies the above demand for ability to etch in a selective way. Anodical dissolution can for example be carried out by electrolysis in diluted sulphuric acid containing chloride ions.

Many different materials can be used for the thin metal layer depending on the method which has been used for the production of the laminate. If the foil laminating method described above is used, the foil which after the laminating step will constitute the thin metal layer usually contains copper. Then the foil can be clad with one or more intermediate, adhesion promoting layers of another or the same metal or a non-metallic material.

If the temporary base method is used instead, the thin metal layer can also contain copper. It can, however, also contain other metals, such as zinc and iron.

The temporary base can, for example, consist of aluminium, nickel, chromium, tin, lead or any one of their alloys. It is also possible to use a temporary base of copper for example which in itself will be dissolved by the dissolvent used. Then it can, however, be advantageous to have an intermediate layer of the above metals or alloys between the temporary base and the thin metal layer on the insulating base.

The material in the thin metal layer on the insulating base is by no means critical for the present invention. Instead, the inventive idea relates to the use of a protective foil or a layer of a material being chemically different from the metal layer, said protective foil or layer being firmly adhering to the thin metal layer and intended for counteracting the formation of big burrs in the metal layer at the machining of holes and also for the purpose of facilitating the subsequent dissolution of the burrs. Thereafter the protective material can be removed in a known way, for example by etching, stripping, tearing off or a combination thereof.

When the protective layers or foil has been removed from the laminate a metal layer having no burrs remains. Consequently, no grinding or any other mechanical machining is necessary. Then the laminate can be treated in a known way for bringing about a conventional printed wiring board with plated through holes.

The method according to the invention can be used for the production of all kinds of printed wiring boards which are provided with plated through holes. Thus, the method is as useful for the production of printed wiring boards with a wiring pattern on one or both sides as well as for the production of so-called multilayer boards.

The method according to the invention is very useful in combination with the so-called base method mentioned above. According to said method a semi-finished product is obtained consisting of an insulating base provided with a metal layer and a temporary base on one or both sides. However, the method according to the invention gives the same advantage in combination with the usual foil laminating process. The grinding step is avoided also in said case. It is in itself meaningless how and when the thin metal layer is provided with the protective layer or foil. At the usual foil laminating method it is possible to equip the metal layer of the produced laminate, for example with a layer of aluminium, nickel, chromium, tin, lead, or any one of their alloys by means of vacuum evaporation, chemical plating, electroplating or the like. At the foil laminating method it is also possible to use a metal foil which in itself can be handled and has been provided with a protective layer of said metals or alloys in a similar way.

The thickness of the thin metal layer on the insulating base is not critical. Usually a layer having a thickness of 1–40 $\mu$m, is used. A metal layer having a thickness up to 70 $\mu$m can, however, be used without any difficulty.

The protective layer or foil can have a thickness amounting to fractions of 1 $\mu$m up to about 200 $\mu$m.

The insulating base in the laminate which is used according to the invention is preferably made of fibre reinforced plastic. At the production of more technically advanced printed wiring boards, a glass fibre reinforced thermosetting plastic, such as epoxy resin, polyester resin or polyimid resin is suitably used as an insulating base.

The invention will be explained more in detail in connection with the embodiment examples shown below. Example 1 relates to a comparison test where a laminate which does not include a protective aluminium foil is drilled. Example 2 shows drilling of a laminate provided with a firmly adhering, protective aluminium foil. Finally, Example 3 relates to a method according to the invention. Then holes are drilled in a laminate comprising a firmly adhering, protective aluminium foil, whereupon the burrs obtained are etched away.

EXAMPLE 1

1500 holes were drilled in a glass fibre reinforced epoxy resin laminate which was clad on both sides with a layer having a thickness of 5 $\mu$m and consisting mainly of copper and zinc. The diameter of the drill was 0,9 mm, the number of revolutions 22500 per minute and the feed 50 $\mu$m per revolution. Burrs having a height of 20 $\mu$m were obtained in the metal layer at many of the holes.

EXAMPLE 2

1500 holes were drilled in the same way as according to Example 1 in a glass fibre reinforced epoxy resin laminate of the same kind as according to Example 1. However, this time the outer surface of the thin metal layer on each side of the laminate was provided with a 50 $\mu$m thick, firmly adhering aluminium foil. At most of the holes burrs having a height of only 3 $\mu$m or less were obtained in the thin metal layer, which shows the positive effect of the aluminium foil at the drilling.

EXAMPLE 3

The process according to Example 2 was repeated. When the holes had been drilled, the laminate was immersed for 90 seconds at 25° C in an etching solution containing 200 g per liter of ammonium persulfate $(NH_4)_2S_2O_8$. Then the laminate was rinsed and the aluminium foils were removed by etching. No burrs could be observed in the remaining metal layers.

The invention is not limited to the embodiments shown as these can be modified in different ways within the scope of the invention.

We claim:

1. In a method for the production of through holes in a laminate used for printed wiring and consisting of an insulating base of glass fiber reinforced thermosetting resin provided on at least one side with a thin continuous layer of copper or copper alloy, comprising
    electroplating said thin continuous layer of copper or copper alloy to a temporary base of a throwaway type comprising a foil of aluminum or an alloy thereof having a thickness of up to about 200 μm,
    laminating said layer of copper or copper alloy on said temporary base under heat and pressure to a final base-forming material consisting of at least one sheet of glass fiber reinforced thermosetting resin, and
    subsequently drilling or punching holes in said laminate causing the formation of burrs in said layer of copper or copper alloy,
    the improvement consisting of
    dissolving said burrs and
    removing the protective foil of aluminum or aluminum foil by etching, stripping, tearing off, or a combination thereof, leaving said thin electroplated layer of copper or copper alloy on the final base and the walls of the holes in said layer of copper or copper alloy being free of burrs.

2. The method of claim 1 wherein said thermosetting resin in said insulating base is selected from the group consisting of epoxy resin, polyester resin, and polyimide resin.

3. The method of claim 1 comprising dissolving said burrs by etching in a solution containing ammonium persulfate, nitric acid, or hydrogen peroxide together with sulfuric acid.

4. The method of claim 1 comprising dissolving said burrs by anodical dissolution.

5. The method of claim 2 comprising dissolving said burrs by etching in a solution containing ammonium persulfate, nitric acid, or hydrogen peroxide together with sulfuric acid.

6. The method of claim 2 comprising dissolving said burrs by anodical dissolution.

7. The method of claim 4 wherein anodical dissolution is carried out by electrolysis in diluted sulfuric acid containing chloride ions.

8. The method of claim 6 wherein anodical dissolution is carried out by electrolysis in diluted sulfuric acid containing chloride ions.

9. The method of claim 1 wherein said thin continuous layer of copper or copper alloy has a thickness of 1 to 40 μm.

* * * * *

UNITED STATES PATENT AND TRADEMARK OFFICE
CERTIFICATE OF CORRECTION

PATENT NO. : 4,023,998
DATED : May 17, 1977
INVENTOR(S) : KJELL A. CEDERBERG et al

It is certified that error appears in the above-identified patent and that said Letters Patent are hereby corrected as shown below:

Column 2, line 13, change "driving" to ---during---.

Column 4, line 7, insert ---temporary--- between "so-called" and "base".

Column 6, line 3, change "foil" to ---alloy---.

Signed and Sealed this

Fourth Day of October 1977

[SEAL]

Attest:

RUTH C. MASON
Attesting Officer

LUTRELLE F. PARKER
Acting Commissioner of Patents and Trademarks